(12) United States Patent
Lee

(10) Patent No.: US 6,411,127 B2
(45) Date of Patent: Jun. 25, 2002

(54) MULTI-LEVEL BONDING OPTION CIRCUIT

(75) Inventor: Kang-Youl Lee, Chungcheongbuk-do (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/855,522

(22) Filed: May 16, 2001

(30) Foreign Application Priority Data

Jun. 14, 2000 (KR) ......................................... 2000-32735

(51) Int. Cl.[7] ......................................... H03K 19/0948
(52) U.S. Cl. ............................. 326/83; 326/86; 326/87; 326/62; 326/68; 327/198; 327/313
(58) Field of Search ................................ 326/83, 86–87, 326/23–24, 62, 68; 327/198, 313

(56) References Cited

U.S. PATENT DOCUMENTS 5,412,333 A * 5/1995 Okunaga ..................... 327/198
5,682,105 A * 10/1997 Fujima ......................... 326/30
6,034,539 A * 3/2000 Hwang ......................... 326/38

* cited by examiner

Primary Examiner—Michael Tokar
Assistant Examiner—Vibol Tan
(74) Attorney, Agent, or Firm—Fleshner & Kim, LLP

(57) ABSTRACT

The present invention relates to a bonding option circuit and a multi-level buffer that generates a plurality of selection signals from a single selective condition applied to a bonding pad to reduce the number of required bonding pads and buffers for a semiconductor device. A multi-level buffer according to the present invention can include a variable voltage divider, a comparator circuit and a logic signal generator. The variable voltage divider produces a first voltage, a second voltage, and a third voltage having voltage levels that are changed in accordance with conditions applied to a pad preferably when the variable voltage divider is activated by a power-up signal. The comparator circuit preferably generates a first comparison result and a second comparison result by being activated by the power-up signal and comparing the first to third voltages. The logic signal generator produces a first buffer output signal and a second buffer output signal.

23 Claims, 5 Drawing Sheets

MULTI-LEVEL BONDING OPTION CIRCUIT

BACKGROUND OF THE INVENTION

1. Field of the Invention

The present invention relates to semiconductor integrated circuit, and more particularly, to a bonding option circuit in a semiconductor integrated circuit.

2. Background of the Related Art

In a semiconductor integrated circuit, circuits having a variety of options for ease of design and test are established on a semiconductor chip to select a required circuit by inputting an external condition therein. For instance, when a semiconductor memory is designed to have one of various input/output structures such as ×4, ×8, ×16 and the like, all the input/output structures of ×4, ×8, ×16 are embodied on a single chip so that one of the structures should be selected in accordance with external conditions. The selective condition inputted from outside to select the single I/O structure. In general, a pad is formed for the selection of the corresponding I/O structure outside the chip, and a signal is applied to the pad.

A pad is for wiring between a chip and a lead frame. The pad is formed on the chip and supplied with a signal of external supply voltage level.

Thus, a buffer is required for transforming the signal applied to the pad into a logic signal of a internal voltage level of the chip. When there are many structures available for selection, one of the structures is selected by supplying selective conditions through at least two pads, and then, the selective conditions are decoded. This kind of circuit is called a bonding option circuit. Such a related art bonding option circuit is shown in FIG. 1 and FIG. 2.

FIG. 1 shows a block diagram of a bonding option circuit according to a related art. As shown in FIG. 1, the bonding option circuit of the related art has a pair of pads 102 and 108 to transmit selection conditions, a pair of buffers 104 and 110 to transform signals of the selection conditions into logic signals of an internal voltage level of a chip, and a decoder 106 to decode the logic signals and select one of the three I/O structures of ×4, ×8 and ×16 in accordance with a combination of the logic signals.

FIG. 2 is a circuit diagram that shows a related art bonding option circuit, which is disclosed in U.S. Pat. No. 5,682,105 (BONDING OPTION CIRCUIT HAVING NO PASS-THROUGH CIRCUIT, 1997.10.28). As shown in FIG. 2 and the abstract of U.S. Pat. No. 5,682,105, a related art bonding option circuit has of a logic gate circuit 2 connected between a bonding pad 1 and a power supply voltage VDD, a load capacitance 4 connected between a ground and the logic gate circuit 2, and an output stabilizing circuit 3 having an input connected to the bonding pad 1 and an output connected to an output terminal OUT. When the bonding pad 1 is floated, the logic gate circuit 2 connects the bonding pad 1 to the power supply voltage VDD. When the bonding pad 1 is grounded, the logic gate circuit 2 cuts off a current path between the bonding pad 1 and the power supply voltage VDD. An objective of the bonding option circuit shown in FIG. 2 is to reduce leakage current generated when the bonding pad 1 is connected to the ground.

As described above, the related art bonding option circuit has various disadvantages. In an aspect of a semiconductor integrated circuit package, an area occupied by a bonding pad is relatively larger than that occupied by a chip. Thus, to reduce the size of the package, reducing the number of bonding pads is preferred to reducing the size of the chip.

However, the bonding option circuit according to the related art should require a pad per selective condition. When the selectable structures are more than three, the number of the bonding pads and the buffers are increased also.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a multi-level buffer that substantially obviates one or more of the problems due to limitations and disadvantages of the related art.

Another object of the present invention is to provide a bonding pad circuit having a multi-level buffer that reduces a number of bonding pads and buffers.

Another object of the present invention is to provide a bonding pad circuit having a multi-level buffer that generates a plurality of selection signals from a single selection condition applied to a bonding pad.

Another object of the present invention is to provide a multi-level buffer generating a plurality of selection signals from a single selective condition applied to a bonding pad in order to reduce the number of the bonding pads and the buffers.

To achieve at least these and other advantages in a whole or in part and in accordance with the purpose of the present invention, as embodied and broadly described, a multi-level buffer according to the present invention includes a first current control circuit, a resistor, a second current control circuit, and a logic signal generator. The first current control circuit is coupled between a first node coupled to a pad and a power supply voltage and has a first current when a power-up signal is not activated and a second current that is larger than the first current when the power-up signal is activated. The resistor is coupled between the first node and a second node so that a voltage difference is generated between the first and second nodes. The second current control circuit is coupled between the second node and a ground and has a third current that is equal to the first current when the power-up signal is not activated and a fourth current that is equal to the second current when the power-up signal is activated. The logic signal generator generates a first buffer output signal and a second buffer output signal, respectively, by transforming signals of the first and second nodes into logic signals of an internal voltage level of a chip.

To further achieve the above objects in a whole or in part, and in accordance with the present invention, a multi-level buffer is provided that includes a variable voltage divider, a comparator circuit, and a logic signal generator. The variable voltage divider generates a first voltage, a second voltage, and a third voltage each having prescribed voltage levels that change in accordance with conditions applied to a pad where the variable voltage divider is activated by a power-up signal. The comparator circuit generates a first comparison result and a second comparison result by comparing the first to third voltages. The logic signal generator generates a first buffer output signal and a second buffer output signal, respectively, by transforming the first and second comparison results into logic signals based on internal voltage levels of a chip.

To further achieve the above objects in a whole or in part, a bonding option circuit according to the present invention is provided that includes a multi-level buffer that includes a first current control circuit coupled between a first node coupled to a pad and a first prescribed reference voltage, wherein a first current flows through the first current control circuit to the first node when a first control signal is not activated, and wherein a second current larger than the first current flows when the first control signal is activated, a resistor coupled between the first node and a second node, wherein a voltage difference is generated between the first and second nodes, a second current control circuit coupled between the second node and a second prescribed reference voltage, wherein a third current substantially equal to the first current flows through the second current control circuit when the first control signal is not activated, and wherein a fourth current substantially equal to the second current flows when the first control signal is activated, and a logic signal generator that generates a first buffer output signal and a second buffer output signal, respectively, by transforming signals of the first and second nodes into logic signals of prescribed internal voltage levels, and a decoder that activates one of a plurality of selection signals by decoding the first and second buffer output signals from the multi-level buffer.

To further achieve the above objects in a whole or in part, a bonding option circuit according to the present invention is provided that includes a variable voltage divider coupled to a pad that generates a first voltage, a second voltage, and a third voltage of which voltage levels are changed in accordance with conditions applied to a pad, wherein the variable voltage divider is activated by a first control signal, a comparator circuit that generates a first comparison result and a second comparison result by comparing the first to third voltages when activated by the first control signal, and a logic signal generator that generates a first buffer output signal and a second buffer output signal, respectively, by transforming the first and second comparison results into logic signals of prescribed internal voltage levels, and a decoder that activates one of a plurality of selection signals by decoding the first and second buffer output signals from the multi-level buffer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
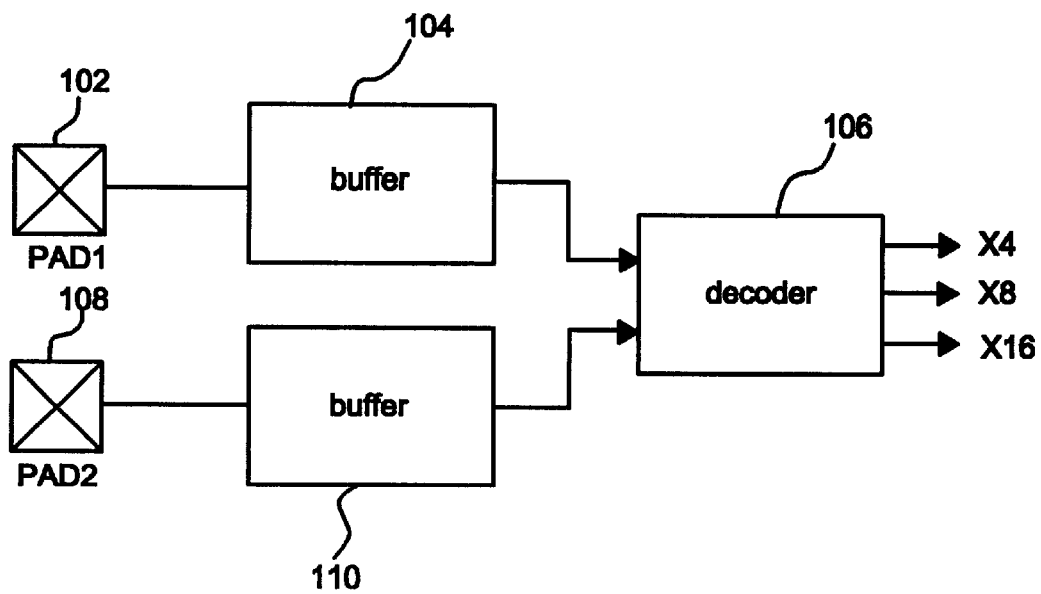
FIG. 1 shows a block diagram of a related art bonding option circuit.
Figure 2:
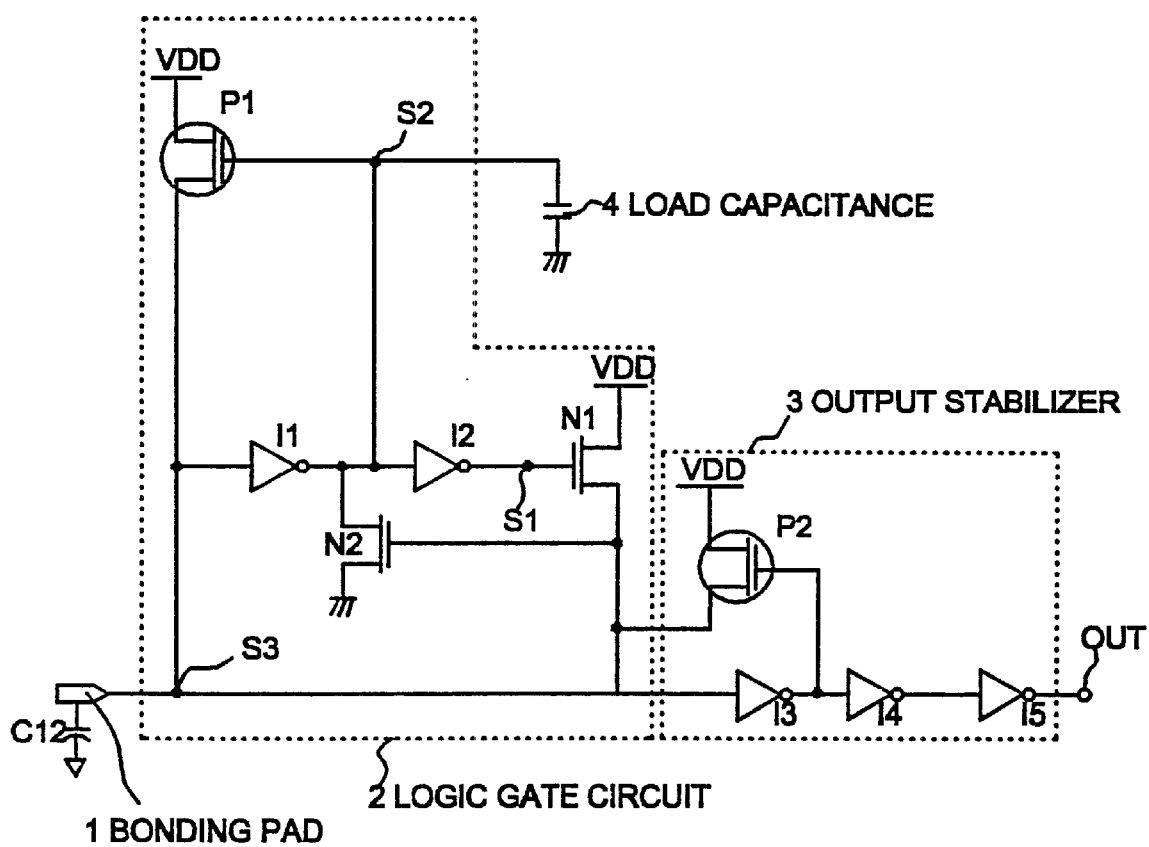
FIG. 2 shows a circuit diagram of a bonding option circuit according to a related art.
Figure 3:
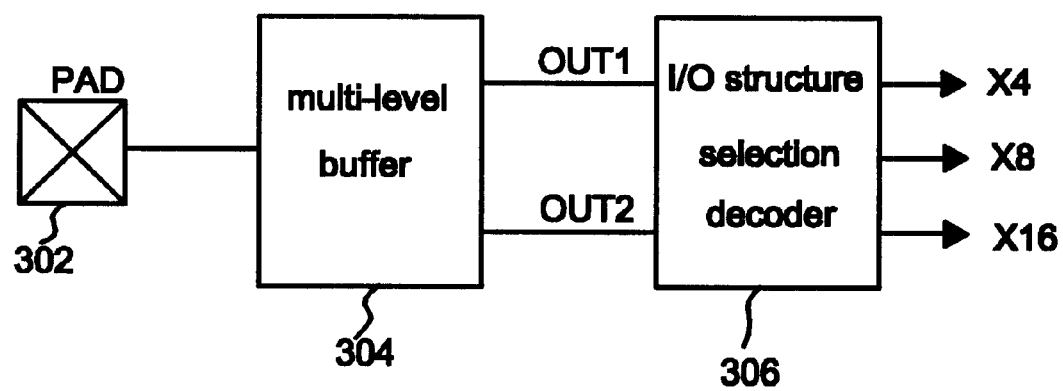
FIG. 3 a block diagram that shows a preferred embodiment of a multi-level bonding option circuit according to the present invention.

FIG. 3 is a block diagram that shows a preferred embodiment of a multi-level bonding option circuit according to the present invention. As shown in FIG. 3, a multi-level buffer 304 according to the present invention is coupled to a pad 302 and generates up to 4 selection signals by preferably decoding two buffer output signals OUT1 and OUT2. As shown in FIG. 3, three of four output signals from the decoder 306 are used as I/O structure selection signals ×4, ×8, ×16 in a semiconductor memory. However, the present invention is not intended to be so limited. For example, the output signals of the decoder 306 may be applicable or used for other integrated circuits including semiconductor memories.

Figure 4:
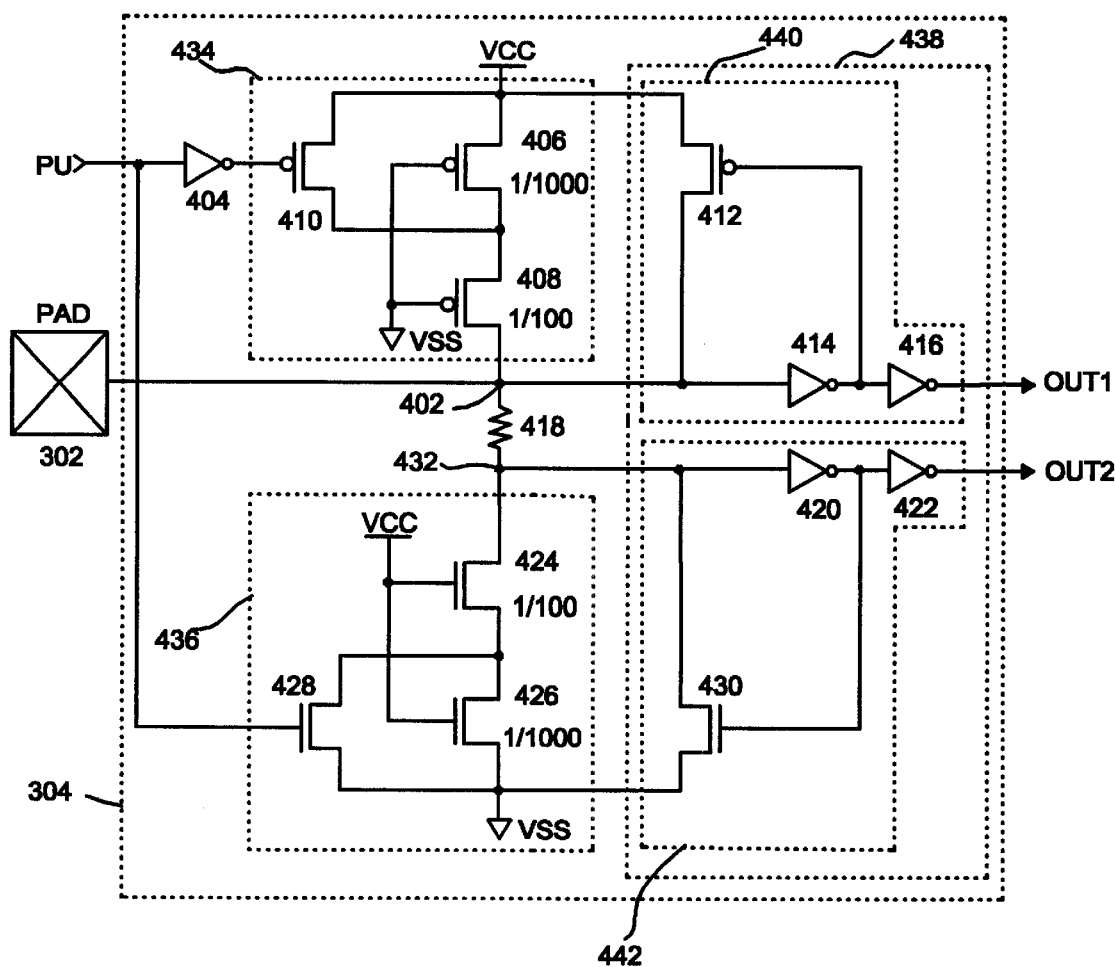
FIG. 4 is a circuit diagram that shows a preferred embodiment of a multi-level buffer according to the present invention.

FIG. 4 is a diagram that shows a circuit of a first preferred embodiment of a multi-level buffer according to the present invention. As shown in FIG. 4, the first preferred embodiment of a multi-level buffer 304 according to the present invention generates a pair of buffer output signals OUT1 and OUT2 having logic values determined by the conditions inputted to the pad 302. The multi-level buffer 304 of the present invention includes a first current control circuit 434, a resistor 418 and a second current control circuit 436 coupled in series between a power supply voltage VCC and a ground VSS. A logic signal generator 438 transforms a node voltage of both ends 402 and 432 of the resistor 418 into a logic signal of an internal voltage level of a chip. The buffer output signals OUT1 and OUT2 are preferably inputted to a decoder. The decoder 306 in FIG. 3 preferably decodes the buffer output signals OUT1 and OUT2 to select one of three I/O structures ×4, ×8, and ×16 in a semiconductor memory.

Two PMOS transistors 406 and 408 in the first current control circuit 434 are coupled in series between the power supply voltage VCC and the pad 302 to form a current path. The respective gates of the PMOS transistors 406 and 408 are preferably coupled to the ground, thereby being always enabled. Channels of the PMOS transistors 406 and 408 are long. In particular, the channel of the PMOS transistor 406 is preferably about 1/1000, which is relatively longer than that of the other PMOS transistor 408 (1/100). Thus, the PMOS transistors 406 and 408 form a very small current path between the power supply voltage VCC and the pad 302.

A drain-source current IDS of the PMOS transistor 406 is designed to preferably be approximately 10% of a current ICC supplied by the power supply voltage VCC when the chip (semiconductor memory) is in power saving mode (e.g., stand-by mode). The other PMOS transistor 410 coupled to the PMOS transistor 406 in parallel forms another current path in the first current control circuit 434. The gate of the PMOS transistor 410 is controlled by a power-up signal PU inverted by an inverter 404. Thus, the PMOS transistor 410 is turned on when the power-up signal PU is at high level. A channel of the PMOS transistor 410 is preferably relatively shorter than that of the other PMOS transistor 406. Accordingly, the PMOS transistor 410 is turned on when the power-up signal PU is at high level to form a large current path between the power supply voltage VCC and the pad 302. Initially, the power-up signal PU preferably tracks the power supply voltage from low to high. Then, the power up signal PU preferably falls to low when the power supply voltage VCC stabilizes at full VCC level.

One end of the resistor 418 is coupled to node 402 at which the PMOS transistor 408 and the pad 302 are coupled to each other. The other end of the resistor 418 is coupled to the second current control circuit 436 and forms the node 432. The resistor 418 brings about a voltage difference between the nodes 402 and 432.

The second current control circuit 436 includes two NMOS transistors 424 and 426 coupled in series between the node 432 and the ground VSS. The second current control circuit 436 forms a current path between the node 432 and the ground VSS. The respective gates of the NMOS transistors 424 and 426 are preferably coupled to the power supply voltage VCC, thereby being always enabled. Channels of the NMOS transistors 424 and 426 are long. In particular, the channel of the NMOS transistor 426 is about 1/1000, which is relatively longer than that of the other NMOS transistor 424 (1/100). Thus, the NMOS transistors 424 and 426 form a very small current path between the node 432 and the ground VSS. A drain-source current IDS of the NMOS transistor 426 is designed to preferably be approximately 10% of the current ICC supplied by the power supply voltage VCC when the chip (semiconductor memory) is in a power saving mode (e.g., stand-by mode). NMOS transistor 428 is coupled to the NMOS transistor 426 in parallel and forms another current path in the second current control circuit 436.

The gate of the NMOS transistor 428 is preferably controlled by the power-up signal PU. Thus, the NMOS transistor 428 is turned on when the power-up signal PU is at high level. A channel of the NMOS transistor 428 is preferably relatively shorter than that of the other NMOS transistor 426. Accordingly, the NMOS transistor 428 is turned on when the power-up signal PU is at high level to form a large current path between the node 432 and the ground VSS.

The logic signal generator 438 includes a first logic signal generator 440 and a second logic signal generator 442. The first logic signal generator 440 includes two inverters 414 and 416 are coupled in series to form a level shifter. The inverters 414 and 416 preferably transform a signal at the node 402 into a logic signal of internal voltage level of the chip, and generates the buffer output signal OUT1.

A PMOS transistor 412 is coupled between the node 402 and the power supply voltage VCC and forms a latch. The PMOS transistor 412, which is turned on by an output of the inverter 414, maintains an output of the inverter 414 as a previous logic state until the voltage level of the node 402 is changed. Consequently, the buffer output signal OUT1 maintains its logic state until the voltage level of the node 402 is changed.

The second logic signal generator 442 includes two inverters 420 and 422 that are coupled in series and preferably form another level shifter. The inverters 420 and 422 transform a signal at the node 432 into the logic signal of the internal voltage level of the chip, and generate the other buffer output signal OUT2. An NMOS transistor 430 that is coupled between the node 432 and the ground VSS forms a latch. The NMOS transistor 430 preferably maintains an output of the inverter 420 as the previous logic state until the voltage of the node 432 is changed. Consequently, the buffer output signal OUT2 maintains its logic state until the voltage level of the node 432 is changed.

Operations of the first preferred embodiment of the multi-level buffer for a bonding option circuit will now be described. When the pad 302 is bonded to the power supply voltage VCC, a level of the power supply voltage VCC appears at the node 402. Thus, the buffer output signal OUT1 becomes logic 1. In this case, voltage drop at the resistor 418 is negligible since the amount of a current through the second current control circuit 436 is very small. Accordingly, the buffer output signal OUT2 becomes logic 1 since the voltage level of the node 432 is similar to that of the power supply voltage VCC.

When the pad 302 is coupled to the ground VSS, the voltage level of the node 402 is equal to the ground VSS. Thus, the buffer output signal OUT1 turns into logic 0. At this time, the voltage level of the node 432 is also approximately equal to the ground VSS. Thus, the buffer output signal OUT2 turns into logic 0.

The power supply voltage VCC and the ground VSS can be considered to be short-circuited via the pad 302 when the pad 302 is coupled to the ground VSS. In this case, the amount of the current passing through the first current control circuit 434 is much smaller than the chip-operating current, and the resistance of the first current control circuit 434 is very high. Thus, the voltage of the node 402 may be interpreted as the level of the ground VSS.

When the pad 302 is opened, both ends of the resistor 418 shows the voltage difference between the power source voltage VCC and the ground VSS since the current sinking from the node 402 to the ground VSS via the second current control circuit 434 is equal to the current supplied to the node 402 from the power supply voltage VCC via the first current control circuit 434. In this case, the buffer output signal OUT1 and the other buffer output signal OUT2 are logic 1 and logic 0, respectively.

Channel sizes of the PMOS transistors 406 and 408 of the first current control circuit 434 and the NMOS transistors 424 and 426 of the second current control circuit 436 are so small that it may take long time to have levels of the power supply voltage VCC and the ground VSS show up. The current flows in the respective current control circuits 436 and 434 are increased by the PMOS and NMOS transistors 410 and 428 in the first and second current control circuits 434 and 436, respectively.

Figure 5:
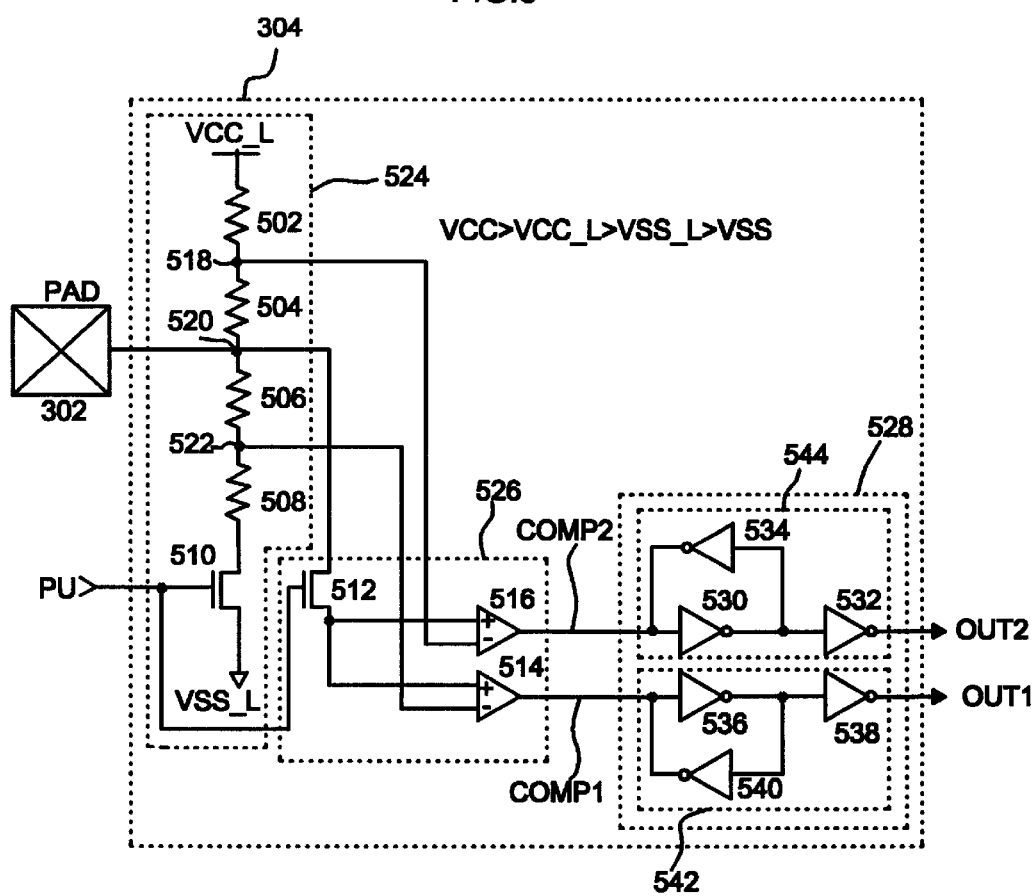
FIG. 5 is a circuit diagram that shows another preferred embodiment of a multi-level buffer according to the present invention.

FIG. 5 is a diagram that shows a second preferred embodiment of a multi-level buffer according to the present invention. As shown in FIG. 5, the second preferred embodiment of the multi-level buffer 304 includes a variable voltage divider 524, a comparator circuit 526, and a logic signal generator 528. The second preferred embodiment of the multi-level buffer 304 generates two buffer output signals OUT1 and OUT2 by selection conditions inputted through the pad 302. In the variable voltage divider 524, four resistors 502, 504, 506, and 508 and an NMOS transistor 510 are preferably coupled in series between an internal power supply voltage VCC_L and an internal ground VSS_L. Three nodes 518, 520, and 522 are formed in the resistors. A signal from the pad 302 is inputted to the node 520. The NMOS transistor 510 is turned on by the power-up signal PU, thereby making the variable voltage divider 524 form a closed-loop circuit.

A voltage range of the internal power supply voltage VCC_L is narrower than that of the power supply voltage VCC coupled to the pad 302. When the range of the power supply voltage VSS-VCC lies between approximately 0-3.3V, a range of the internal power supply voltage VSS_L-VCC_L is preferably about 80%, which lies between approximately 0.6–2.7V, of VSS-VCC.

The comparator circuit 526 includes a first comparator 514, a second comparator 516, and an NMOS transistor 512 that operates as a switch controlling an input signal from the node 520. A drain and a source of the NMOS transistor 512 are coupled to the node 520 and non-inversion inputs(+) of the first and second comparators 514 and 516, respectively. The NMOS transistor 512 is turned on by the power-up signal PU.

To the first comparator 514, a signal of the node 520 is inputted as a reference signal through the NMOS transistor 512, and the signal of the node 522 is directly input as a comparison signal. The first comparator 514 outputs a comparison result COMP1 of low level provided that the comparison signal V522 (e.g., voltage) is higher than the reference signal V520. On the other hand, a comparison result COMP1 of high level is outputted provided that the comparison result V522 is lower than the reference signal V520.

To the second comparator 516, a signal of the node 520 as a reference signal is inputted through the NMOS transistor 512 and the signal of the node 518 as a comparison signal is directly input to the inversion input. The second comparator 516 outputs a comparison result COMP2 of low level provided that the comparison signal V518 is higher than the reference signal V520. On the other hand, the second comparator 516 outputs the comparison result COMP2 of high level provided that the comparison signal V518 is lower than the reference signal V520.

Operations of the second preferred embodiment of the multi-level buffer shown in FIG. 5 will now be described. When the pad 302 is coupled to the power supply voltage VCC and the power-up signal PU is activated, the node voltage V518 is lower than the node voltage V520 and is higher than the node voltage V522. Thus, the comparison result COMP1 and the other comparison result COMP2 are at high level(V520>V518>V522, COMP1=COMP2=HIGH).

When the pad 302 is coupled to the ground VSS and the power-up signal PU is activated, the node voltage V518 is higher than the node voltage V520 and is lower than the node voltage V522. Thus, the comparison result COMP1 and the comparison result COMP2 are at low level (V520<V518<V522, COMP1=COMP2=LOW).

When the pad 302 is opened and the power-up signal PU is activated, the node voltage V520 is lower than the node voltage V518 and higher than the node voltage V522. Thus, the comparison result COMP1 and the comparison result COMP2 are at high and low level, respectively (V518>V520>V522, COMP1=HIGH, COMP2=LOW).

The logic signal generator 528 includes a first level shifter 542 and a second level shifter 544. In the first level shifter 542, two inverters 536 and 538 coupled in series preferably transform the first comparison result COMP1 into a logic signal of the internal voltage level of the chip, and generate the buffer output signal OUT1. An inverter 540 inverts and feeds back an output of the inverter 536 to an input of the inverter 536. The inverter 540 keeps a logic state of the output of the inverter 536 until the input voltage of the inverter 536 is changed. As a result, the buffer output signal OUT1 maintains its logic state until the input voltage of the inverter 536 is changed.

In the second level transformer 544, two inverters 530 and 532 coupled in series preferably transform the output of the second comparator 516 into a logic signal of the internal voltage level of the chip, and generate the buffer output signal OUT2. An inverter 534 inverts and feeds back an output of the inverter 530 to an input of the inverter 530. The inverter 534 keeps a logic state of the output of the inverter 530 until input voltage of the inverter 530 is changed. As a result, the buffer output signal OUT2 maintains its logic state until the input voltage of the inverter 530 is changed.

As described above, preferred embodiments of a multi-level bonding option circuit and a multi-level buffer according to the present invention enable generation of a plurality of structure selection signals by receiving selection conditions inputted through a single pad. If selection signals amounting to M are to be generated, the number of pads amounting to N/2 preferably should be provided mathematically where 2N>M. Actually, a plurality of bonding pads amounting to the positive integer part of N/2 are required. Accordingly, the preferred embodiments of a multi-level buffer according to the present invention reduce a semiconductor package size by lessening the number of bonding pads required for generating selection signals of a perspective number.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A multi-level buffer, comprising:
   a first node for connection to a pad;
   a first current control circuit coupled between the first node and a first prescribed reference voltage, wherein a first current flows through the first current control circuit to the first node when a first control signal is not activated, and wherein a second current larger than the first current flows when the first control signal is activated;
   a resistor coupled between the first node and a second node;
   a second current control circuit coupled between the second node and a second prescribed reference voltage, wherein a third current substantially equal to the first current flows through the second current control circuit when the first control signal is not activated, and wherein a fourth current substantially equal to the second current flows when the first control signal is activated; and
   a logic signal generator that generates a first buffer output signal and a second buffer output signal, respectively, by transforming signals of the first and second nodes into logic signals of prescribed internal voltage levels.

2. The multi-level buffer according to claim 1, wherein the first current control circuit comprises:
   a first current path coupled between the first node and the first prescribed reference voltage, wherein the first current through the first circuit path is less than a chip stand-by mode current; and
   a second current path coupled in parallel to the first current path, wherein the second current larger than the first current flows through the second current path when a power-up signal is activated.

3. The multi-level buffer according to claim 1, wherein the first current control circuit comprises:
   a first current path including a first transistor and a second transistor that are coupled in series between the first prescribed reference voltage and the first node, wherein each control electrode of the first and second transistors are coupled to the second prescribed reference voltage; and
   a second current path through which the second current flows has a third transistor coupled in parallel to the first transistor and wherein the third transistor is activated responsive to the first control signal.

4. The multi-level buffer according to claim 1, wherein the second current control circuit comprises:

a third current path coupled between the second node and the second prescribed reference voltage, wherein the third current flows through the third current path; and a fourth current path coupled in parallel to the third current path, wherein the fourth current flows through the fourth current path and wherein the fourth current path is activated by a power-up signal.

5. The multi-level buffer according to claim 1, wherein the second current control circuit further comprises:

a third current path having a first transistor and a second transistor that are coupled in series between the second node and the second prescribed reference voltage, wherein each control electrode of the first and second transistors are coupled to the first prescribed reference voltage, and wherein channels of the first and second transistors have ratios of 1/100 and 1/1000, respectively; and a fourth current path through which the fourth current flows has a third transistor with a channel shorter than the second transistor coupled in parallel to the first transistor, and wherein the third transistor is activated by the first control signal.

6. The multi-level buffer according to claim 1, wherein the logic signal generator comprises:

a first logic signal generator that comprises, a first level shifter that generates the first buffer output signal by receiving the first node signal and transforming the first node signal into a corresponding logic signal of the prescribed internal voltage levels, and a first latch that maintains a logic state of an output of the first level shifter until a voltage of the first node is changed; and a second logic signal generator that comprises, a second level shifter that generates the second buffer output signal by receiving the second node signal and transforming the second node signal into a corresponding logic signal using the prescribed internal voltage levels, and a second latch that maintains a logic state of an output of the second level shifter until a voltage of the second node is changed.

7. A multi-level bonding option circuit, comprising:

a multi-level buffer that comprises, a first current control circuit coupled between a first node coupled to a pad and a first prescribed reference voltage, wherein a first current flows through the first current control circuit to the first node when a first control signal is not activated, and wherein a second current larger than the first current flows when the first control signal is activated, a resistor coupled between the first node and a second node, wherein a voltage difference is generated between the first and second nodes, a second current control circuit coupled between the second node and a second prescribed reference voltage, wherein a third current substantially equal to the first current flows through the second current control circuit when the first control signal is not activated, and wherein a fourth current substantially equal to the second current flows when the first control signal is activated, and a logic signal generator that generates a first buffer output signal and a second buffer output signal, respectively, by transforming signals of the first and second nodes into logic signals of prescribed internal voltage levels; and a decoder that activates one of a plurality of selection signals by decoding the first and second buffer output signals from the multi-level buffer.

8. The multi-level bonding option circuit according to claim 7, wherein the first current control circuit comprises:

a first current path coupled between the first node and the first prescribed reference voltage, wherein the first current through the first current path is less than a stand-by mode current; and a second current path coupled in parallel to the first current path, wherein the second current larger than the first current flows through the second current path when the first control signal is activated.

9. The multi-level bonding option circuit according to claim 7, wherein the first current control circuit comprises:

a first current path including a first transistor and a second transistor that are coupled in series between the first prescribed reference voltage and the first node, wherein each control electrode of the first and second transistors are coupled to the second prescribed reference voltage, and wherein channels of the first and second transistors have ratios of 1/1000 and 1/100, respectively; and a second current path through which the second current flows has a third transistor with a channel shorter than the first transistor is coupled in parallel to the first transistor, and wherein the third transistor is activated responsive to the first control signal.

10. The multi-level bonding option circuit according to claim 7, wherein the second current control circuit comprises:

a third current path coupled between the second node and the second prescribed reference voltage, wherein the third current flows through the third current path; and a fourth current path coupled in parallel to the third current path, wherein the fourth current flows through the fourth current path, and wherein the fourth current path is activated by the first control signal.

11. The multi-level bonding option circuit according to claim 7, wherein the second current control circuit comprises:

a third current path having a first transistor and a second transistor that are coupled in series between the second node and the second prescribed reference voltage, wherein each control electrode of the first and second transistors are coupled to the first prescribed reference voltage, and wherein channels of the first and second transistors have ratios of 1/100 and 1/1000, respectively; and a fourth current path through which the fourth current flows, has a third transistor with a channel shorter than the second transistor coupled to the first transistor in parallel, and, wherein the third transistor is activated by the first control signal.

12. The multi-level bonding option circuit according to claim 11, wherein the first current control circuit comprises:

a first current path including a fourth transistor and a fifth transistor that are coupled in series between the first prescribed reference voltage and the first node, wherein each control electrode of the fourth and fifth transistors are coupled to the second prescribed reference voltage, and wherein channels of the fourth and fifth transistors have ratios of 1/1000 and 1/100, respectively; and a second current path through which the second current flows has a sixth transistor with a channel shorter than the fourth transistor is coupled in parallel to the fourth transistor, and wherein the sixth transistor is activated responsive to the first control signal, wherein the logic signal generator comprises,
a first level shifter that generates the first buffer output signal by receiving the first node signal and transforming the first node signal into a corresponding logic signal of the prescribed internal voltage levels,
a first latch that maintains a logic state of an output of the first level shifter until a voltage of the first node is changed,
a second level shifter that generates the second buffer output signal by receiving the second node signal and transforming the second node signal into a corresponding logic signal using the prescribed internal voltage levels, and
a second latch that maintains a logic state of an output of the second level shifter until a voltage of the second node is changed.

13. The multi-level bonding option circuit according to claim 7, wherein the logic signal generator comprises:
a first logic signal generator that comprises,
a first level shifter that generates the first buffer output signal by receiving the first node signal and transforming the first node signal into a corresponding logic signal of the prescribed internal voltage levels, and
a first latch that maintains a logic state of an output of the first level shifter until a voltage of the first node is changed; and
a second logic signal generator that comprises,
a second level shifter that generates the second buffer output signal by receiving the second node signal and transforming the second node signal into a corresponding logic signal using the prescribed internal voltage levels, and
a second latch that maintains a logic state of an output of the second level shifter until a voltage of the second node is changed.

14. A multi-level buffer, comprising:
a variable voltage divider coupled to a pad that generates a first voltage, a second voltage, and a third voltage of which voltage levels are changed in accordance with conditions applied to a pad, wherein the variable voltage divider is activated by a first control signal;
a comparator circuit that generates a first comparison result and a second comparison result by comparing the first to third voltages when activated by the first control signal; and
a logic signal generator that generates a first buffer output signal and a second buffer output signal, respectively, by transforming the first and second comparison results into logic signals of internal voltage levels of a corresponding chip.

15. The multi-level buffer according to claim 14, wherein the first through third voltage levels of the variable voltage divider vary such that the first voltage is lower than the second voltage and higher than the third voltage when the pad is coupled to a first reference voltage, the first voltage is higher than the second voltage and lower than the third voltage when the pad is coupled to a second reference voltage and the second voltage is lower than the first voltage and higher than the third voltage when the pad is open.

16. The multi-level buffer according to claim 15, wherein the variable voltage divider comprises a first resistor to a fourth resistor and a first switch coupled in series between a third reference voltage higher than the second reference voltage and a fourth reference voltage between the first and third reference voltages to form an in-series resistor circuit, wherein the first voltage is generated by forming a first node at which the first and second resistors are coupled,
wherein the second voltage is generated by forming a second node at which the second and third resistors are coupled that receives a signal from the pad,
wherein the third voltage is generated by forming a third node at which the third and fourth resistors are coupled, and
wherein the in-series resistor circuit becomes a closed loop circuit as the first switch is turned on by the first control signal.

17. The multi-level buffer according to claim 14, wherein the comparator circuit comprises:
a second switch turned on by the first control signal;
a first comparator that generates the first comparison result of a first prescribed level when the second voltage is higher than the third voltage and generates the first comparison result of a second prescribed level when the second voltage is lower than the third voltage; and
a second comparator that generates the second comparison result of the first prescribed level when the second voltage is higher than the first voltage and generates the second comparison result of the second prescribed level when the second voltage is lower than the first voltage.

18. The multi-level buffer according to claim 14, wherein the logic signal generator comprises:
a first level shifter that generates the first buffer output signal by transforming the first comparison result into a first logic signal of the internal voltage levels, wherein the first level shifter comprises,
a first inverter and a second inverter coupled in series, and
a first latch that maintains a logic stage of the first buffer output signal until an input voltage of the first inverter is changed; and
a second level shifter that generates the second buffer output signal by transforming the second comparison result into a second logic signal of the internal voltage levels, wherein the second level shifter comprises,
a third inverter and a fourth inverter coupled in series, and
a second latch that maintains a logic state of the first buffer output signal until an input voltage of the third inverter is changed.

19. A multi-level bonding option circuit, comprising:
a variable voltage divider coupled to a pad that generates a first voltage, a second voltage, and a third voltage of which voltage levels are changed in accordance with conditions applied to a pad, wherein the variable voltage divider is activated by a first control signal;
a comparator circuit that generates a first comparison result and a second comparison result by comparing the first to third voltages when activated by the first control signal; and
a logic signal generator that generates a first buffer output signal and a second buffer output signal, respectively, by transforming the first and second comparison results into logic signals of prescribed internal voltage levels; and
a decoder that activates one of a plurality of selection signals by decoding the first and second buffer output signals from the multi-level buffer.

20. The multi-level bonding option circuit according to claim 19, wherein the first through third voltage levels of the variable voltage divider vary such that the first voltage is lower than the second voltage and higher than the third voltage when the pad is coupled to a first reference voltage, wherein the first voltage is higher than the second voltage and lower than the third voltage when the pad is coupled to a second reference voltage, and wherein the second voltage is lower than the first voltage and higher than the third voltage when the pad is open.

21. The multi-level bonding option circuit according to claim 19, wherein the variable voltage divider comprises a first resistor, a second resistor, a third resistor, a fourth resistor and a first switch coupled in series between an internal ground and an internal power supply voltage, which has a voltage level lower than a power supply voltage, to form an in-series resistor circuit, wherein the first voltage is generated at a first node where the first and second resistors are coupled, wherein the second voltage is generated at a second node where the second and third resistors are coupled and a signal from the pad is inputted to the second node, and wherein the third voltage is generated at a third node where the third and fourth resistors are coupled.

22. The multi-level bonding option circuit according to claim 21, the comparator circuit comprising:

a second switch turned on by the first control signal;

a first comparator that generates the first comparison result of a first prescribed level when the second voltage is higher than the third voltage and generates the first comparison result of a second prescribed level when the second voltage is lower than the third voltage; and a second comparator that generates the second comparison result of the first prescribed level when the second voltage is higher than the first voltage and generates the second comparison result of the second prescribed level when the second voltage is lower than the first voltage.

23. The multi-level bonding option circuit according to claim 22, the logic signal generator comprises:

a first level shifter that generates the first buffer output signal by transforming the first comparison result into a first logic signal of the prescribed internal voltage levels, wherein the first level shifter comprises, a first inverter and a second inverter coupled in series, and a first latch that maintains a logic stage of the first buffer output signal until an input voltage of the first inverter is changed; and a second level shifter that generates the second buffer output signal by transforming the second comparison result into a second logic signal of the prescribed internal voltage levels, wherein the second level shifter comprises, a third inverter and a fourth inverter coupled in series, and a second latch that maintains a logic state of the first buffer output signal until an input voltage of the third inverter is changed.

* * * * *